(12) United States Patent
Juengling

(10) Patent No.: US 6,207,564 B1
(45) Date of Patent: **\*Mar. 27, 2001**

(54) METHOD OF FORMING SELF-ALIGNED ISOLATED PLUGGED CONTACTS

(75) Inventor: Werner Juengling, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/237,482

(22) Filed: Jan. 26, 1999

Related U.S. Application Data

(60) Continuation of application No. 08/931,822, filed on Sep. 16, 1997, now Pat. No. 5,864,156, which is a division of application No. 08/572,969, filed on Dec. 15, 1995, now Pat. No. 5,700,706.

(51) Int. Cl.$^7$ ...................................................... H01L 21/44
(52) U.S. Cl. ........................................... 438/666; 438/238
(58) Field of Search ..................................... 438/253–256, 438/238–240, 293–399, 618–681

(56) References Cited

U.S. PATENT DOCUMENTS 5,700,706 * 12/1997 Juengling .

* cited by examiner

Primary Examiner—Jey Tsai
(74) Attorney, Agent, or Firm—Workman, Nydegger & Seeley

(57) ABSTRACT

A method for preparing an SRAM or DRAM structure on a substrate with an oppositely doped well therein, a field oxide region extending above and between the well and the substrate, first and second N-MOS transistors on the silicon substrate, and a P-MOS transistor on the silicon well. The source and drain regions of each of the P-MOS transistor and the first and second N-MOS transistors each have a polysilicon plug making contact therewith. Each polysilicon plug is isolated one from another by nitride spacers, has the same doping as the region with which it makes contact, and is self-aligned to the nitride spacers lining the passage of the polysilicon plugs to their respective contacts on either the silicon substrate or the silicon well. The self-aligned nature of the polysilicon plugs is due to the nitride spacers formed by etchant selectivities and photoresist masks.

34 Claims, 14 Drawing Sheets

METHOD OF FORMING SELF-ALIGNED ISOLATED PLUGGED CONTACTS

This application is a continuation of U.S. patent application Ser. No. 08/931,822, filed on Sep. 16, 1997, now U.S. Pat. No. 5,864,156 which is a divisional of U.S. patent application Ser. No. 08/572,969, filed on Dec. 15, 1995, now U.S. Pat. No. 5,700,706, both of which are incorporated herein by reference.

BACKGROUND OF THE INVENTION

1. The Field of the Invention

The present invention relates to the manufacture of semiconductor circuit devices. More particularly, the present invention is directed to a novel process which permits the formation of self-aligned polysilicon plugged contacts using nitride spacers and a polishing step to isolate the plugged contacts one from another.

2. The Relevant Technology

A challenge in current semiconductor design is the increasing pattern density and continuously smaller feature size during printing of DRAM arrays. This applies also for the printing and manufacturing of polysilicon plugs which are used in current DRAM technology to contact conductive layers e.g. the active area regions of a semiconductor to the conductive layers at a higher level.

In the current application this could be the connection between a source region of an access transistor in a memory cell to a tungsten plug of a bitline contact and the connection between the drain region of the access transistor to the storage container of the DRAM cell. Polysilicon plugs are required below every storage node and below every bitline contact.

The plugs have to meet two opposing requirements. Firstly, they have to be as large as possible to lower the electrical resistance and provide a good and easy alignment of the cell container or the bitline tungsten plug to the existing polysilicon plug. Secondly, they must be electrically isolated from each other, i.e. a space between the features during printing has to be maintained. Assuming all features are at minimum size, the space between the plugs has to be at the same size as the plug itself, which in turn limits the size of the plug.

One way to improve the situation is to print the polysilicon plug for the bitline contact with one mask and to print the polysilicon plugs for the cell containers using a different mask and alignment/exposure sequence. In this case, the pattern density is smaller and the polysilicon plugs can be enlarged without the risk of "photoresist scumming" during the exposure due to sub-minimum spaces between features. Highly accurate alignment becomes an important issue in this approach.

Consequently, it would be an advance in the art to overcome these problems by a creative processing sequence of masks, etchings, and order of fabrication process steps.

SUMMARY AND OBJECTS OF THE INVENTION

In the novel process flow taught herein for fabrication of dynamic random access memory structures, at least two masks are required for the manufacturing of polysilicon plugs. A first mask opens up contacts for the formation of polysilicon plugs to the drain of an access transistor above which a cell capacitor will be formed. The second mask opens up contacts for the formation of polysilicon plugs to the source of an access transistor above which a tungsten plug will be formed to connect to the bitline of the memory device. The second mask can also be used to plug NMOS devices in the periphery. If PMOS devices should be connected with a p-doped polysilicon plug, a third mask is required.

The first and second masks must be self-aligned to the edge of the access transistor in the array on the foundational silicon substrate of structure and also to the adjacent polysilicon plug so as to avoid shorts between polysilicon plugs and the access transistor, as well as between adjacent doped plugs to be formed. Such shorts are the result of misalignment between the plug masks or large line size variations of the first and/or second plug(s) to be formed.

In the inventive process, shorts between misaligned polysilicon plugs are avoided by surrounding at least one of the two polysilicon plugs with a thin isolating nitride spacer. The spacers are formed by isotropically depositing a thin nitride film and etching it back using a very anisotropic etch leaving only the vertical parts of the nitride film.

The nitride spacer is formed at the vertical wall of the contact hole after the contact hole is etched into the oxide but before the contact hole is filled with doped polysilicon, thereby surrounding the polysilicon plug laterally.

The possibility to self-aligning the two polysilicon plugs against each other permits printing of the polysilicon plug below the cell capacitor as well as the printing of the plug below the bit line contact which will be larger than as if the plug where printed at the same time. Isolation between the plugs is not obtained by line size control and accurate alignment, but rather by the surrounding nitride spacer sealing the plugs laterally against each other. This permits effective spacings between plugs down to 200 Angstroms which is the spacer thickness, rather than 3000 Angstroms which would be the photolithographic limit. Vertical isolation between the plugs is obtained by CMP steps or etchback of the plug forming polysilicon deposited to fill the contact openings.

Another aspect of depositing the doped polysilicon plugs at the contacts in two masking steps is that the printing of the first mask (e.g. the cell plate node plug) with the smallest feature size can take advantage of contacts having only one size. Further, the first mask which opens up contacts for the cellnode plugs is nearly identical to the mask defining the cell container. Additionally, the lithography needs to be developed only once for two layers, and alignment of the two layers is more readily accomplished if the printing is similar.

In furtherance of the advantage of depositing the doped polysilicon plugs at the contacts in two masking steps, it can be stated that the process integration can take advantage of the contacts opened by the first and second masks to improve the transistors in the periphery by using source/drain implants as well as punch through suppression implants after the second mask opens its respective contacts, while maintaining low leakage junctions at the cellnode side by not implanting into these areas late in the processing steps.

In an alternative embodiment of the invention process flow taught herein for fabrication of dynamic random access memory structures (DRAM), a third mask is required. The third mask opens up contacts to P-MOS devices of the periphery. Like the second mask described above (e.g. the bitline contact plug mask), the printing of the third mask is similar to a conventional gate mask.

The self-aligning aspect of the invention enables very small spaces between the polysilicon plugs printed at different mask levels. Thereby the unusable space is minimized and the present inventive method is an advance in the exploitation of memory area.

These and other objects and features of the present invention will become more fully apparent from the following description and appended claims, or may be learned by the practice of the invention as set forth hereinafter

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawing depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
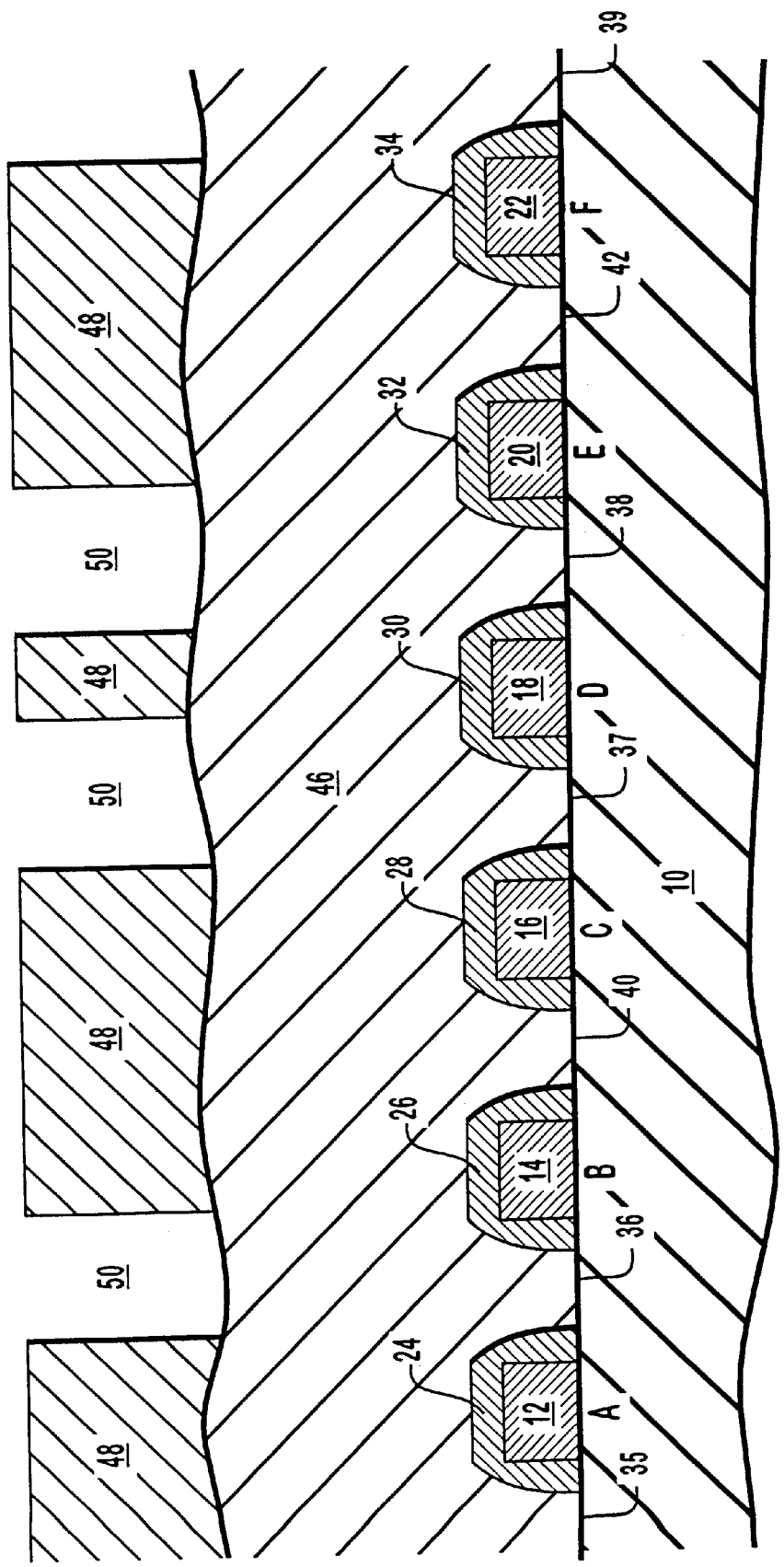
FIG. 1 is a cross-sectional elevation view illustrating a semiconductor substrate having six transistors thereon, over which a passivation layer is situated, and a patterned photoresist layer is upon the passivation layer.

FIG. 1 shows a semiconductor structure consisting of a P-doped polysilicon substrate 10 having MOS devices A, B, C, D, E, and F situated thereon. Each MOS device A–F, respectively, has an N-doped polysilicon gate electrode 12, 14, 16, 18, 20 and 22. Each N-doped polysilicon gate electrode 12–22 has sealed thereover, respectively, a first nitride spacer 24, 26, 28, 30, 32, and 34 each of which has vertically oriented sides in contact with P-doped silicon substrate 10.

P-doped silicon substrate 10 is a surface over which a series of cellnode contacts 36, 37, 38, and 39 are situated. Each cellnode contact 35–39 defines a locus at which a cellnode plug will be situated to serve as a foundation for a cell capacitor to be built thereon. P-doped silicon substrate 10 also features two bitline contacts 40, 42 thereon.

Situated above cellnode contacts 36–39, bitline contacts 40–42, and first nitride spacers 24–34 is a BPSG layer 46 that was deposited and flowed onto P-doped silicon substrate 10. Situated over BPSG layer 46 is a first photoresist layer 48 having patterned therein a first photoresist pattern 50. To make first photoresist pattern 50, a mask 41A is aligned with first photoresist layer 48, followed by an exposure and a development of first photoresist layer 48 so as to form first photoresist patterns 50 seen in FIG. 1.

Figure 2:
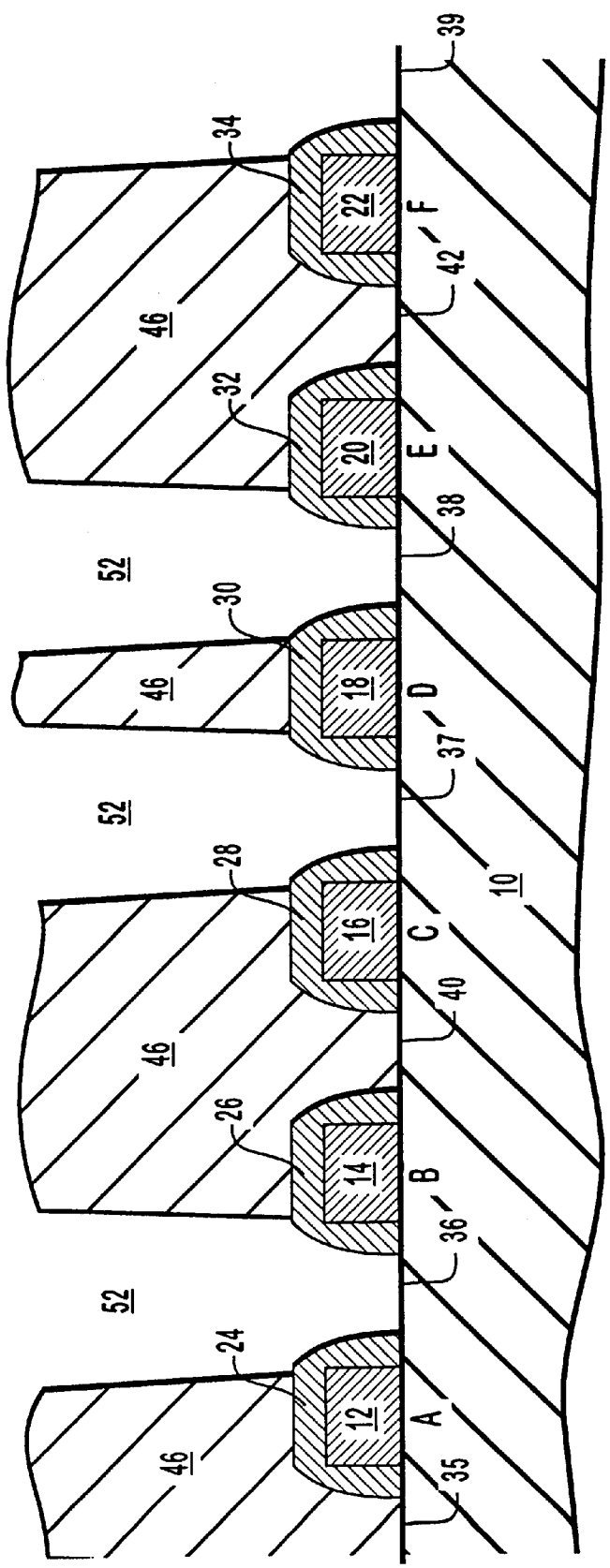
FIG. 2 is a cross-sectional elevation view of the structure seen in FIG. 1, to which an etching step has been performed, and the pattern photoresist layer removed, so as to create a series of cellnode contacts over which cell capacitors will be subsequently built.
Figure 2A:
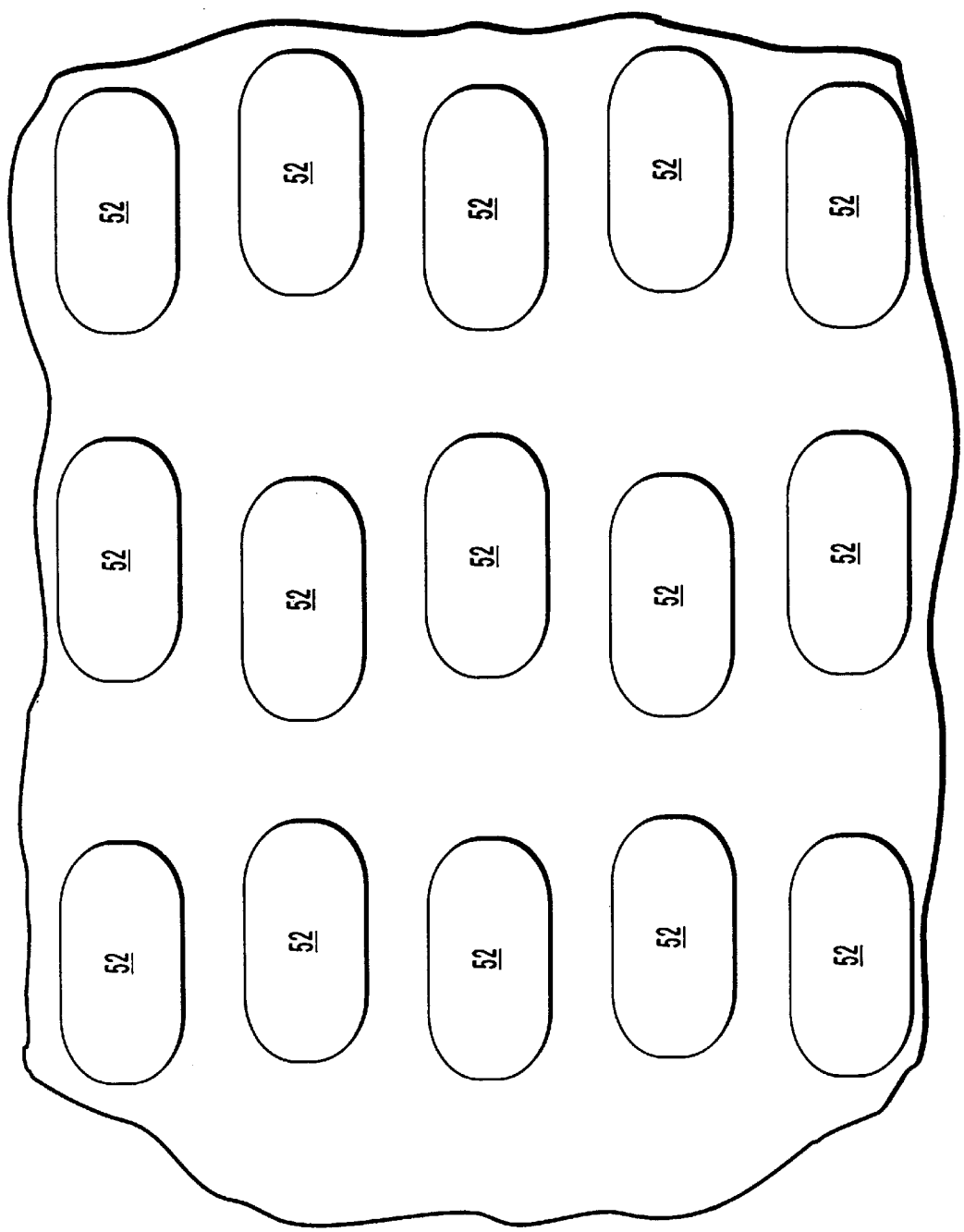
FIG. 2A is an alternatively scaled top plan view of FIG. 2.

FIG. 2 shows the result of additional processing steps to the structure seen in FIG. 1. First, an etching step etches BPSG layer 46 with selectivity to nitride spacers 24–34, N-doped polysilicon gate electrodes 12–22, and P-doped polysilicon substrate 10. The result of this etching step is a first etch pattern 52 seen in FIG. 2. First etch pattern 52 exposes cellnode contacts 36, 37, 38, and 39 over which cell capacitors will be subsequently built.

Figure 3:
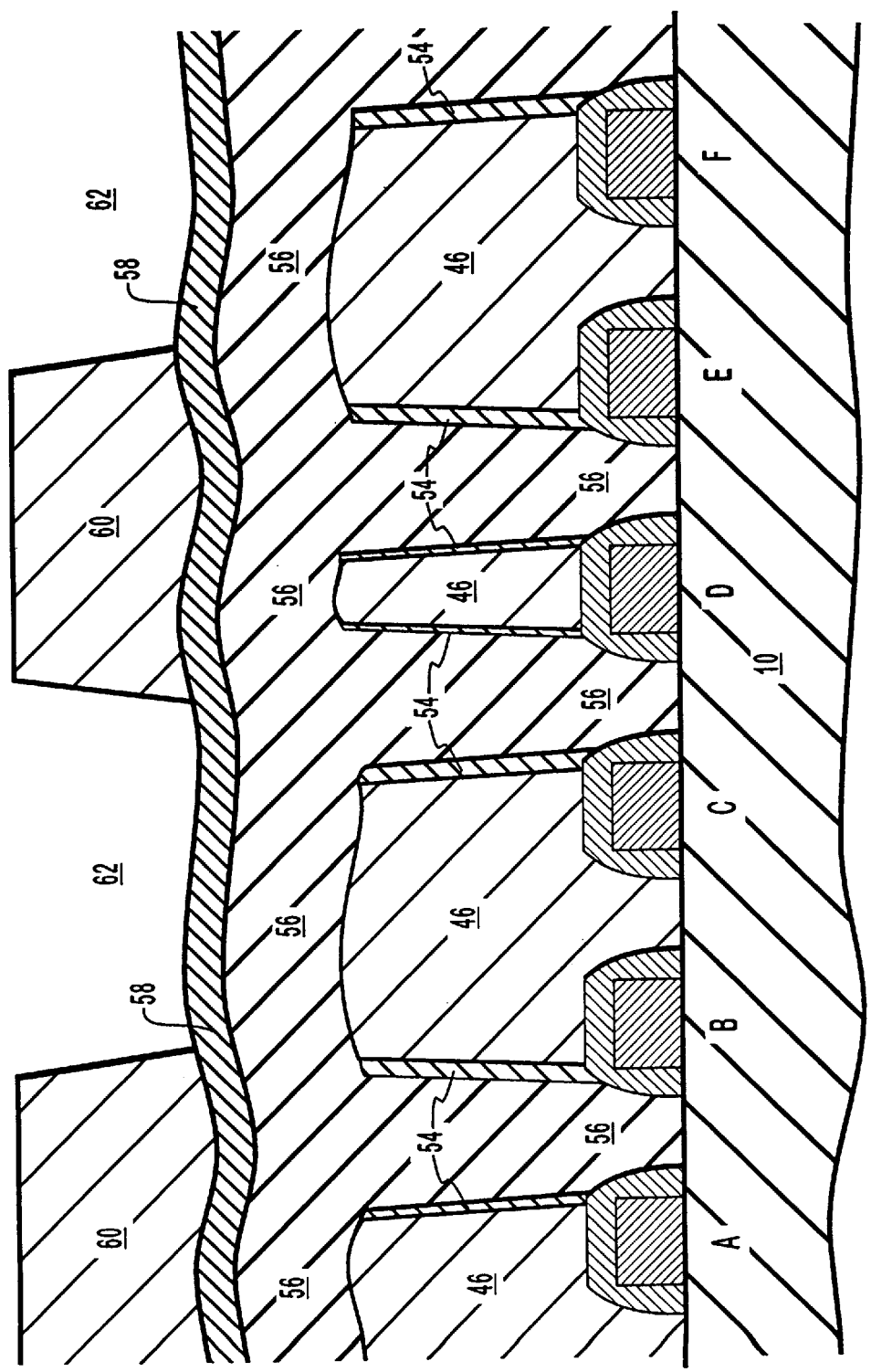
FIG. 3 is a cross-sectional elevation view of the structure seen in FIG. 2, and shows the result of additional fabrication processing steps thereto, including the addition of a nitride spacer to remnants of the passivation layer, the addition of an N-doped polysilicon layer, the addition of a second passivation layer, and the addition of a second patterned photoresist layer.

FIG. 3 shows the results of additional processing steps upon the structure seen in FIG. 2. Initially, a substantially vertically oriented second nitride spacer 54 is formed over each remaining BPSG layer 46 by deposition and anisotropic etch of a thin nitride film (not shown) having a thickness from about 100 Å to about 300 Å. Next, an N-doped polysilicon layer 56 is deposited over exposed cellnode contacts 36, 37, 38, and 39, as well as over MOS devices A–F. An optional thin oxide layer 58 having a thickness from about 300 Å to about 1000 Å, is deposited over N-doped polysilicon layer 56. A second photoresist layer 60 is then applied over thin oxide layer 58. Second photoresist layer 60 is aligned with a mask, exposed to UV light, and is developed so as to form a second photoresist pattern 62 seen in FIG. 3.

Figure 4:
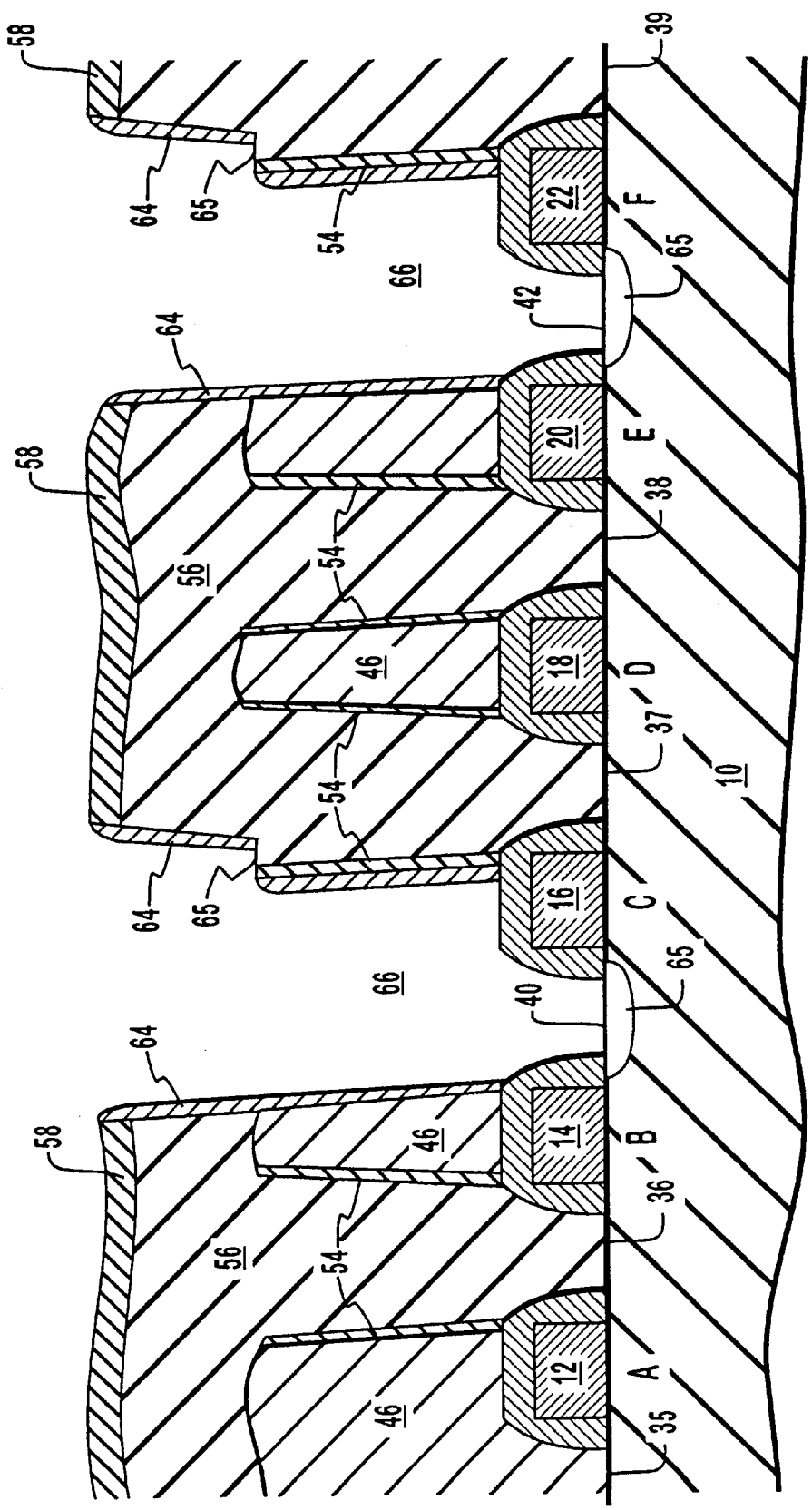
FIG. 4 is a cross-sectional elevation view of the structure seen in FIG. 3, and shows the results of additional fabrication processing steps thereto, including etching through both the second passivation layer and the second N-doped polysilicon layer so as to contact two bitline contacts at the silicon substrate, and the cleaning off of the second patterned photoresist layer from the structure.
Figure 4A:
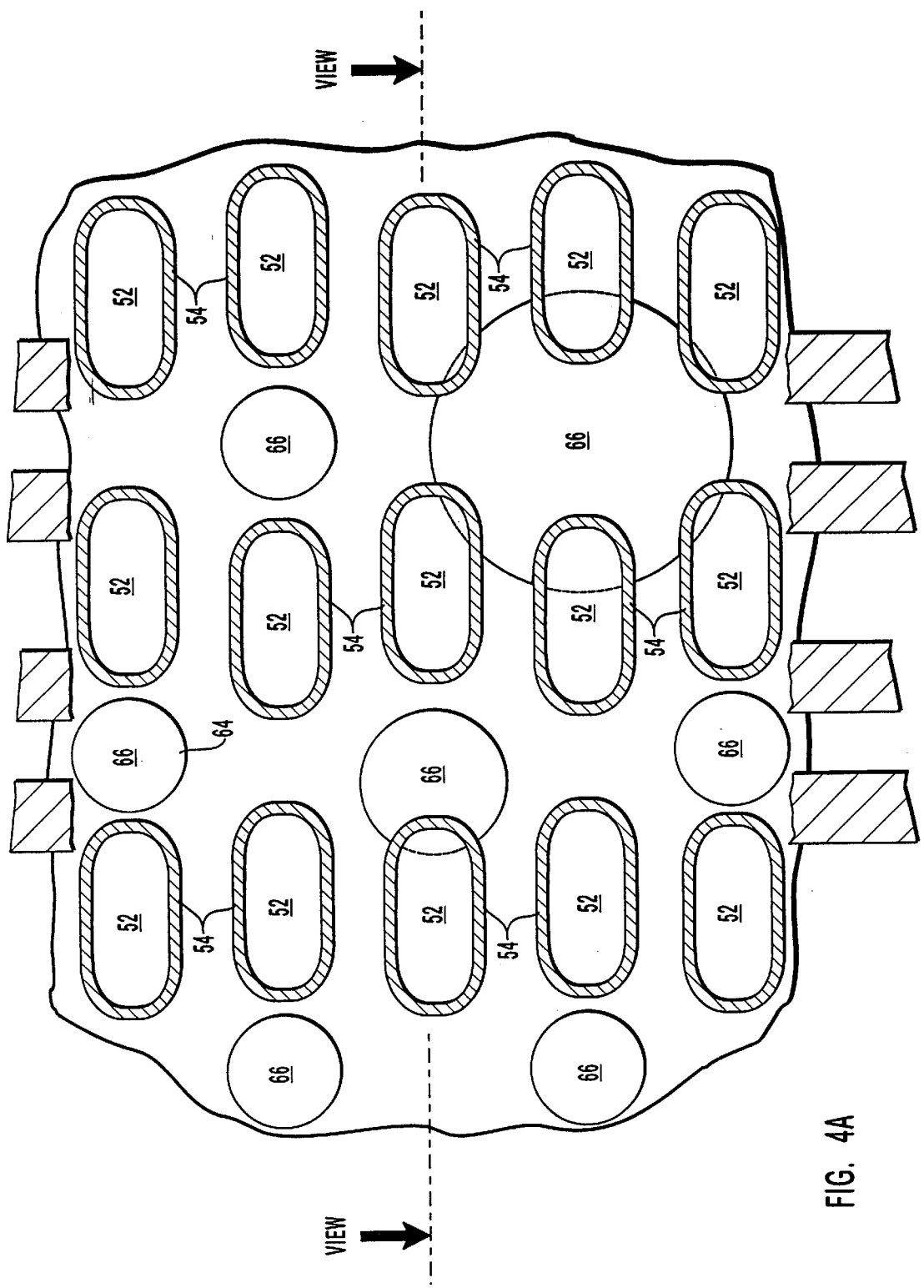
FIG. 4A is an alternatively scaled top plan view of FIG. 4.

FIG. 4 shows the result of several processing steps applied to the structure shown in FIG. 3. Particularly, a second etching step exposes bitline contacts 40 and 42 at P-doped silicon substrate 10 so as to form a second etch pattern 66 seen in FIG. 4.

In the second etch step, a first etch component etches thin oxide layer 58. A second etch component of the second etch step etches N-doped polysilicon layer 56 with selectivity to oxide layer 46 and second nitride spacer 54. A third etch component then etches BPSG layer 46 with selectivity to second nitride spacer 54, nitride spacers 24–34 (seen in FIG. 1) surrounding N-doped polysilicon electrodes 12–22, and P-doped silicon substrate 10. Next, a substantially vertically oriented third nitride spacer 64 is formed over N-doped polysilicon layer 56 remaining after the second etching step. Third nitride spacer 64 is formed by deposition and anisotropic back etch of a thin nitride film (not shown) having a thickness from about 100 Å to about 300 Å.

If the first and the second polysilicon plugs do not overlap as seen in the left half of second etch pattern 66 in FIG. 4, third nitride spacer 64 contains only a vertical component and is not essential for the isolation between the first and second polysilicon plugs. Isolation between these two plugs would have been obtained by remaining BPSG 46 but is enhanced by second nitride spacer 54 and third nitride spacer 64. In case of overlapping of the first and second plugs, as seen in the right half of the second etch pattern 66, spacers 54, 64 become desirable for the isolation between the two plugs. This, the spacers guarantee only a lateral isolation as opposed to a vertical isolation between the plugs.

In FIG. 4 there are two locations 65 where the anisotropic spacer etch removes the horizontal part of the deposited nitride and exposes the first polysilicon plug 56. These undesired "shorts" will be removed by a CMP step as seen figures for further processing steps. Optionally, N-doped active areas 65 can be implanted by ion implants at bitline contacts 40, 42.

Above electrode 16 of MOS device C at second nitride spacer 54, a double spacer is seen in FIG. 4. The double spacer, which is due to misalignment, will preferably have a thickness of about 200 Å.

Figure 5:
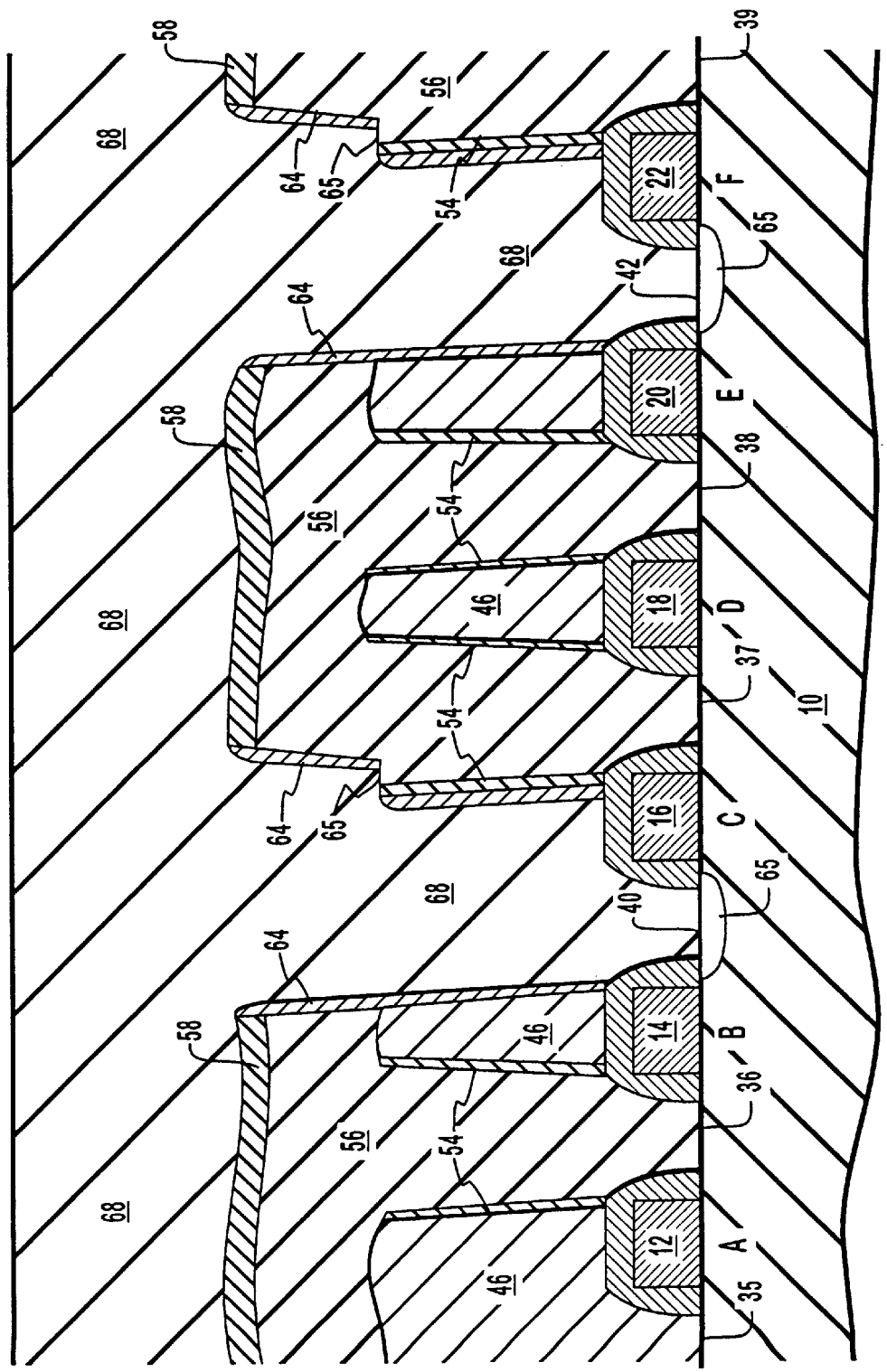
FIG. 5 shows the addition of a second polysilicon layer to the structure shown in FIG. 4 so as to make contact with the two exposed bitline contacts.

The structure of FIG. 4 has been processed so as to result in that structure seen in FIG. 5, and is more particularly the addition of an N-doped polysilicon layer 68 so as to cover over the remainder of thin oxide layer 58, third nitride spacer 64, and bitline contacts 40, 42. N-doped polysilicon layer 68 may be optionally dry back etched to stop on thin oxide layer 58. This optional dry back etch step of N-doped polysilicon layer 58 helps to reduce stress therein.

Figure 6:
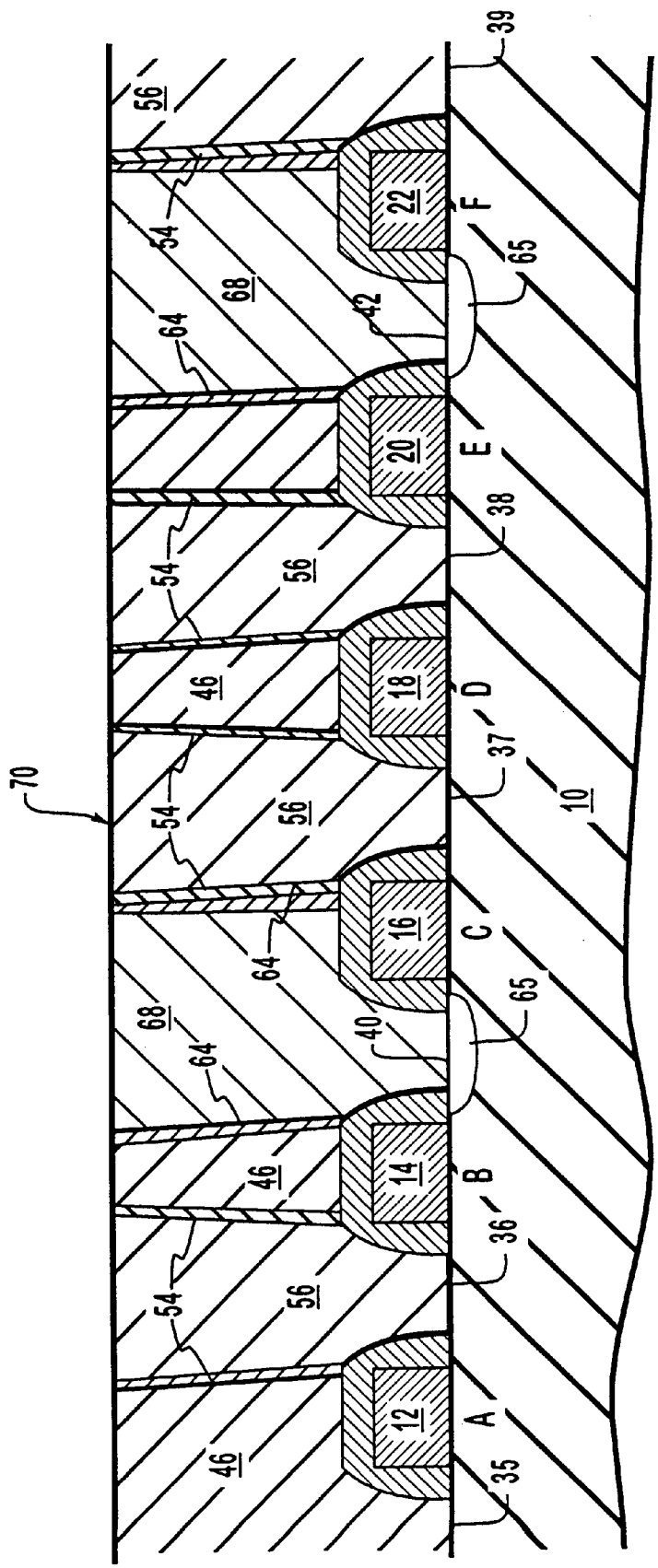
FIG. 6 shows the result of a chemical-mechanical polishing step to the structure seen in FIG. 5 that isolates each of the resultant polysilicon plugs one from another, which polysilicon plugs were polysilicon layers that made contact with either a cellnode contact or a bit contact.

In FIG. 6, a chemical-mechanical polishing step has been effected below oxide layer 58 so as to isolate N-doped polysilicon layers 56, 68 and avoid shorting especially at location 65 where the two plugs overlap. The remaining N-doped polysilicon layers 56, 68 are called plugs and make contact, respectively, with cellnode contacts 36, 37, 38, and 39, or bitline contacts 40, 42. These plugs are separated either by a sequence of second nitride spacer 54, BPSG layer 46, third nitride spacer 64, or are separated by second and third nitride spacers 54, 64 due to a misalignment of the aforedescribed two masking steps. Third nitride spacer 64 is seen above MOS devices C, F and immediately upon first and second nitride spacers 28, 34 as seen in FIG. 1.

The depicted polysilicon plugs are separated either by a sequence of nitride spacers and BPSG layer, or are separated by a lone nitride spacer due to a misalignment of the aforedescribed first and second masking steps. Such a lone nitride spacer formed from misalignment is seen upon and vertically rising immediately above first nitride spacer 28 of MOS device C and second nitride spacer 34 above MOS device F as seen in FIG. 1.

An alternative embodiment of the invention process flow taught herein for fabrication of dynamic random access memory structures (DRAM) is seen in FIGS. 7 through 10. In the alternative embodiment, a third mask is required. The third mask can be initiated following formation of polysilicon plugs 68, or following the optional step of dry etchbacking N-doped polysilicon layer 68. The purpose of the third mask is to open up contacts to P-MOS devices residing in an N-doped silicon well adjacent to a junction with P-doped silicon substrate 10 seen in FIGS. 1–6.

Figure 7:
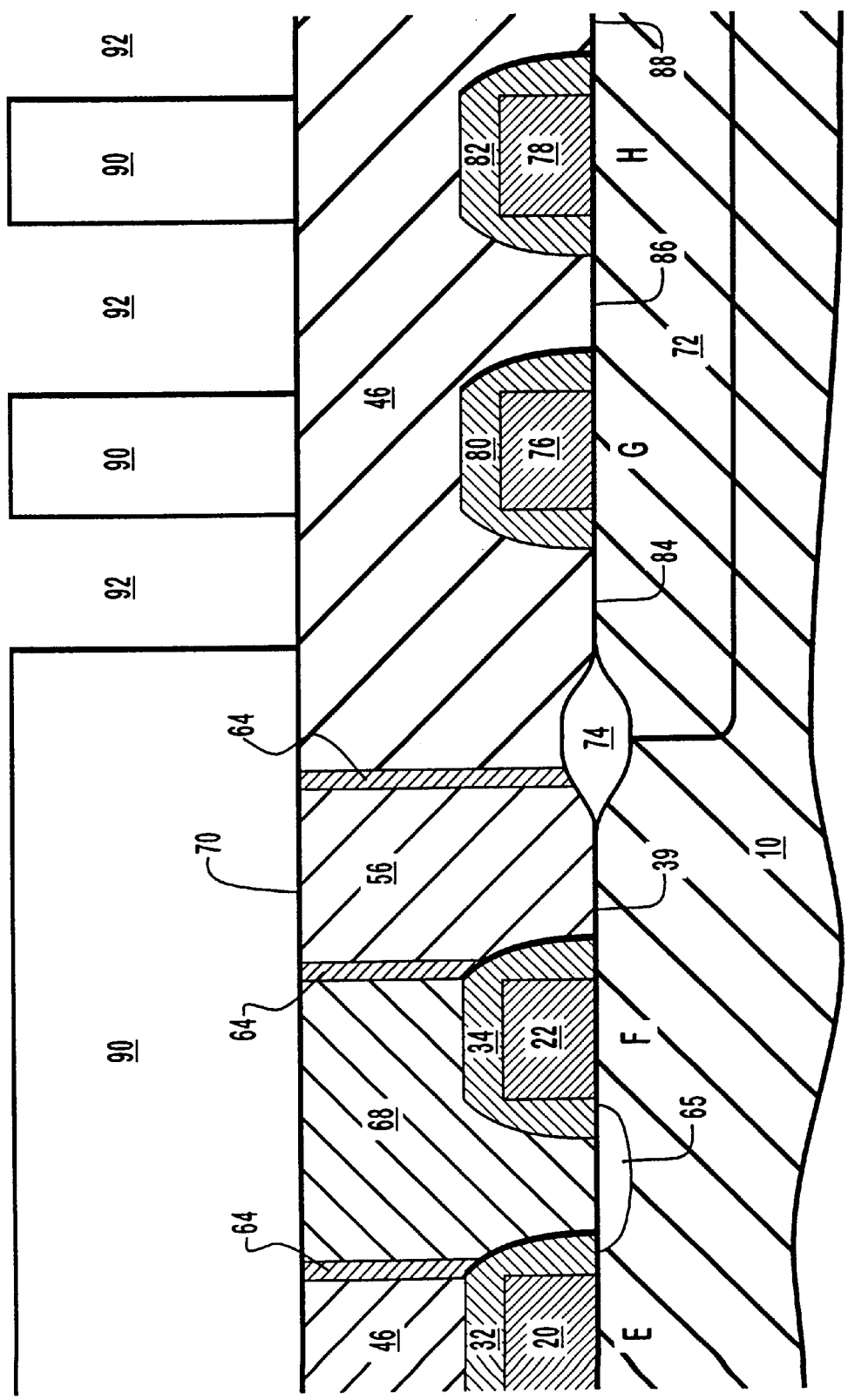
FIG. 7 is a cross-sectional elevational partial view of the structure seen in FIG. 5, showing also P-MOS devices above an N-doped silicon well next to a junction with the P-doped polysilicon substrate, and shows the result of additional fabrication processing steps thereto, including the addition of a third patterned photoresist layer.

In FIG. 7, a field oxide region 74 is separate from MOS devices G and H which reside upon N-doped silicon well 72 and have, respectively, a doped polysilicon gate electrode 76, 78 sealed under a fourth nitride spacer 80, 82 in contact with N-doped silicon well 72. The structure seen in FIGS. 6 and 7 has a third photoresist layer 90 applied over BPSG layer 46, N-doped polysilicon layer 68, and N-doped polysilicon layer 56. Third photoresist layer 90 is aligned with a mask, exposed to UV light, and is developed so as to form a third photoresist pattern 92.

Figure 8:
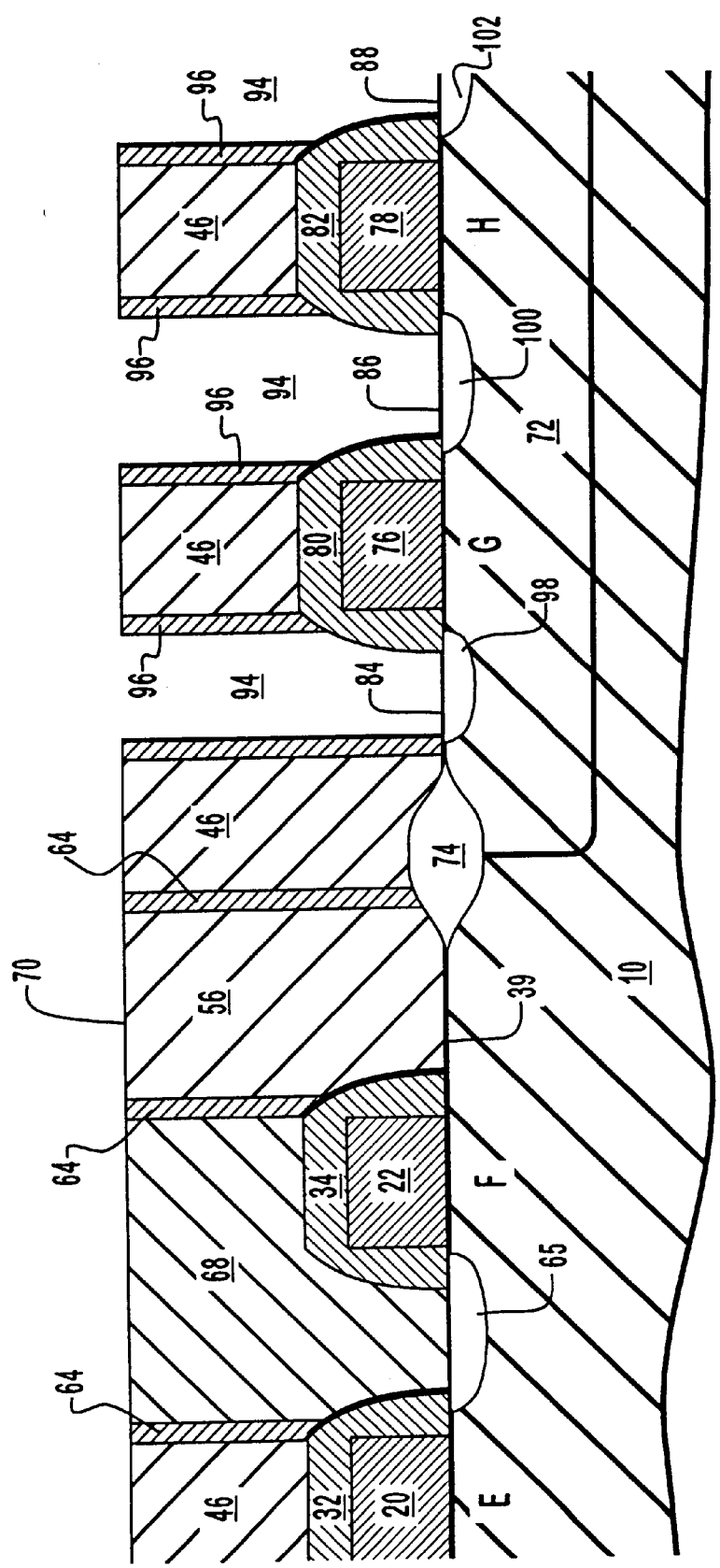
FIG. 8 is a cross-sectional elevation view of the structure seen in FIG. 7, and shows the results of additional fabrication processing steps thereto, including etching through both the third patterned photoresist layer, removing the photoresist, adding a nitride spacer to the transistor to avoid cross contamination between plugged contacts, and adding ion implanted regions in the N-doped silicon well to optimize the P-MOS devices.

FIG. 8 shows the results of processing the structure seen in FIG. 7 with a third etching step that etches through oxide layer 46 to expose P-MOS device contacts 84, 86, 88 to MOS devices G, H in the periphery at N-doped silicon well 72 and to form a third etch pattern 94 seen in FIG. 8. Optionally, a substantially vertically oriented fourth nitride spacer 96 is applied over BPSG layer 46 situated above MOS devices G, H remaining after the third etching step. Fourth nitride spacer 96, which is formed by deposition and anisotropic backetch of a thin nitride film (not shown), having a thickness from about 100 Å to about 300 Å, serves to avoid cross contamination of the resultant P-doped polysilicon plugs from the surrounding BPSG. It is also optional to implant P-doped active areas 98, 100, 102 in the contacts 84, 86, 88 to MOS devices G, H in the periphery at N-doped silicon well 72 so as to optimize these P-MOS devices.

Figure 9:
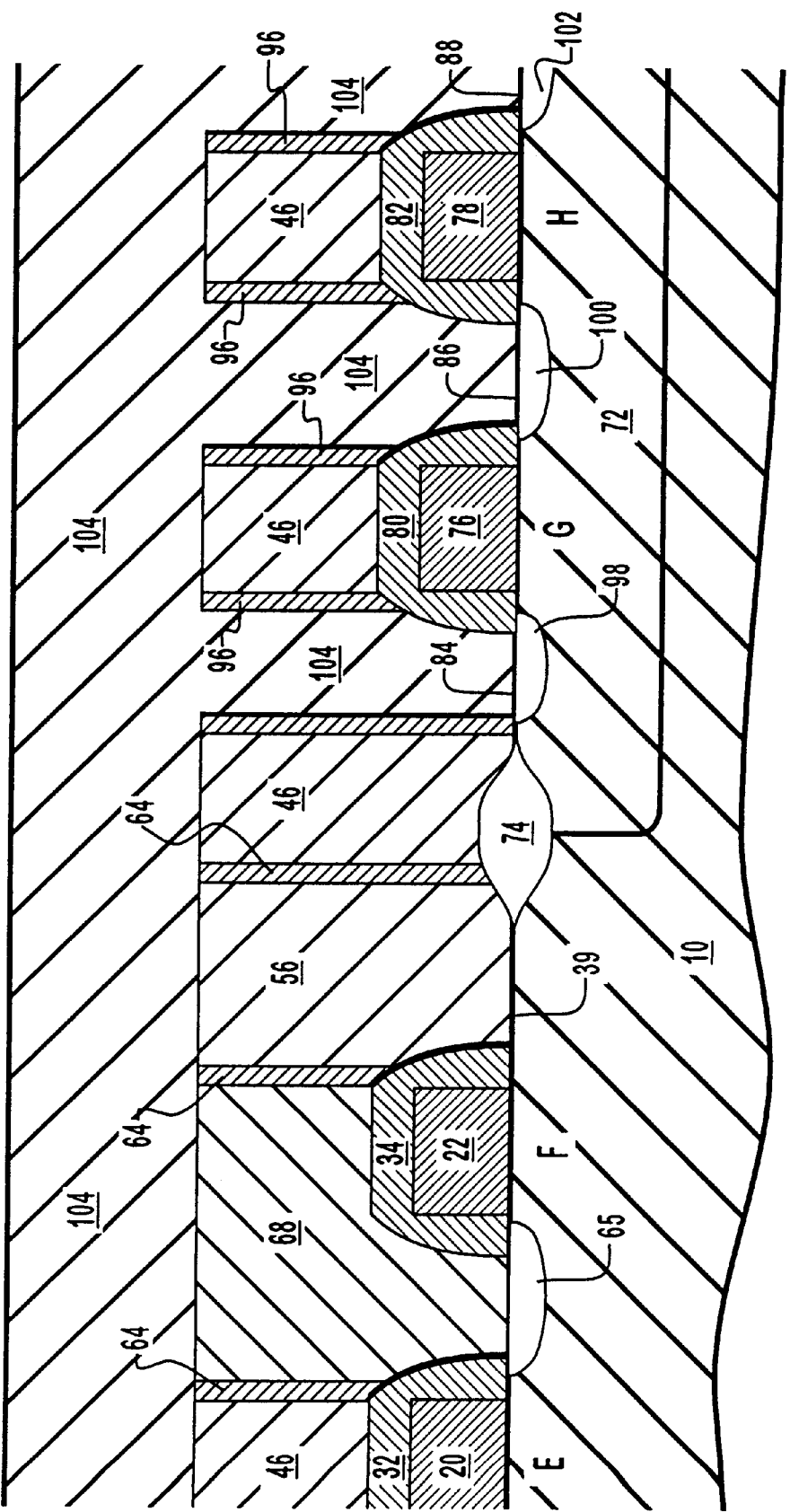
FIG. 9 shows the deposition of a first P-doped polysilicon layer so as to contact the ion implanted active areas for the P-MOS devices.

In FIG. 9, a P-doped polysilicon layer 104 is deposited over the contacts 84, 86, 88 to the P-MOS devices G, H in the periphery at N-doped silicon well 72 which will form the P-doped polysilicon plugs thereat. As a further optional step, P-doped polysilicon layer 104 can be dry etched back.

Figure 10:
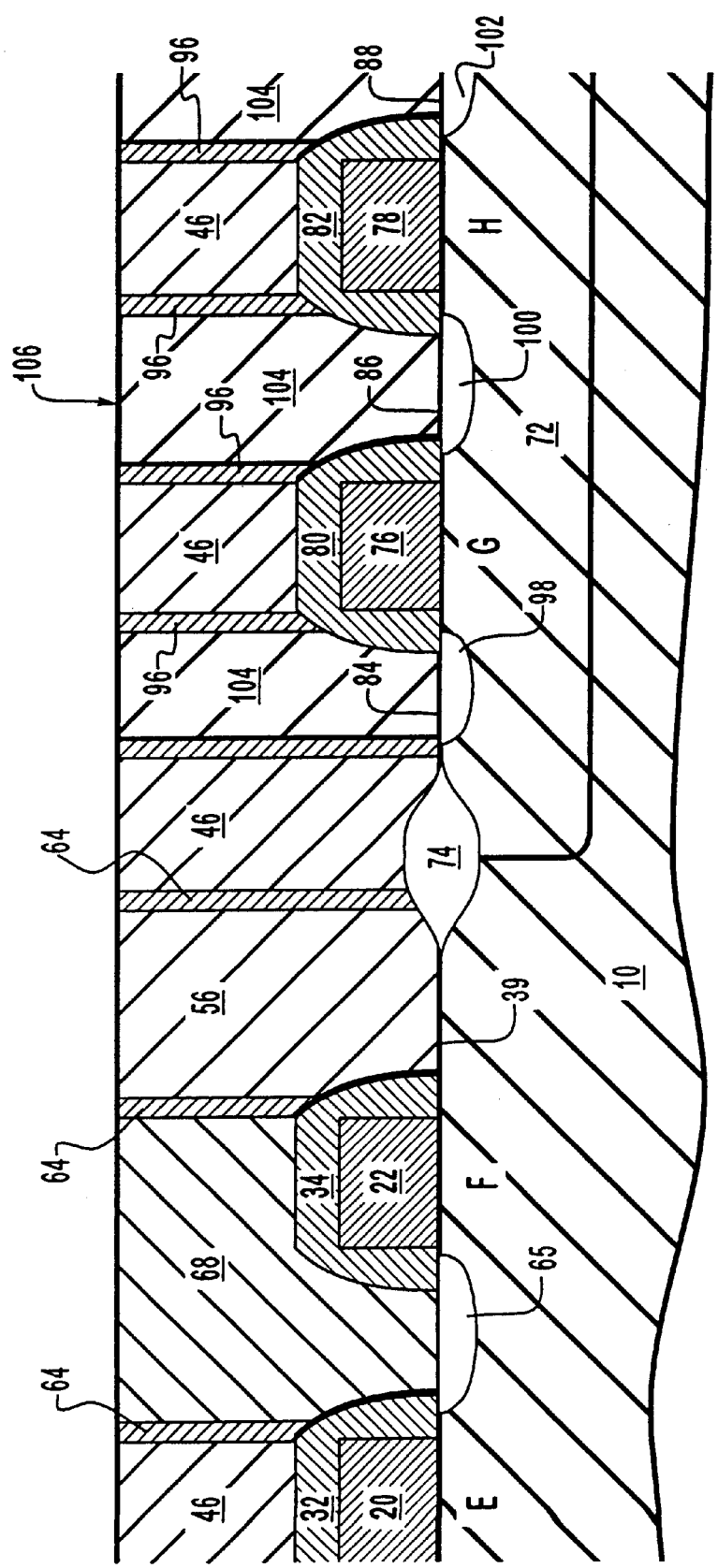
FIG. 10 shows the result of a chemical-mechanical polishing step to the structure seen in FIG. 9 that isolates each of the resultant polysilicon plugs one from another, which polysilicon plugs were doped polysilicon layers that made contact with either a cellnode contact, a bit contact, or a P-MOS device.

Following the foregoing steps of applying a third mask, FIG. 10 shows the results of a chemical-mechanical polishing step applied to all of the then exposed BPSG and polysilicon layers 46, 56, 68, and 104 at the same rate so that the polysilicon plugs remaining from the first, second, and third masks are isolated one from another and will not short out.

The order of the three masks described herein can be varied. Preferably, the first masking step described above will be performed before the other two masking steps for reasons described below. Particularly, the first mask should precede the other masks because N-doped polysilicon layer 56 is the thinnest and introduces the least stress. Preferably, N-doped polysilicon layer 56 will having a thickness from about 1500 Å to about 4000 Å. Additionally, N-doped polysilicon layer 68 and P-doped polysilicon layer 104 are each thicker than N-doped polysilicon layer 56 and should stay on the exposed portions of P-doped silicon substrate 10 and N-doped silicon well 72 for an abbreviated period of time during fabrication processing steps. Preferably, N-doped polysilicon layer 68 will have a thickness from about 3000 Å to about 8000 Å, and P-doped polysilicon layer 104 will have a thickness from about 3000 Å to about 8000 Å.

The thickness of the polysilicon layers is determined by the size of the plugs which have to be filled. The first polysilicon layer 56 has to fill only the plugs connecting to the cell capacitors in the array, which are typically less than 0.4 micrometers wide and always have a simple shape of a square or rectangle. The second and third polysilicon layers 68 and 104 have to fill the plug for the bitline contact which is usually as small as the plug for the cell node, but in addition can and will be used to fill the plugs connecting the source/drain regions of NMOS and PMOS devices in the periphery of the DRAM to the tungsten plugs. These plugs can have twice the size of the plugs used in the DRAM array and can have more complicated shapes which can require thicker polysilicon films to obtain completely filled plugs.

Figure 6A:
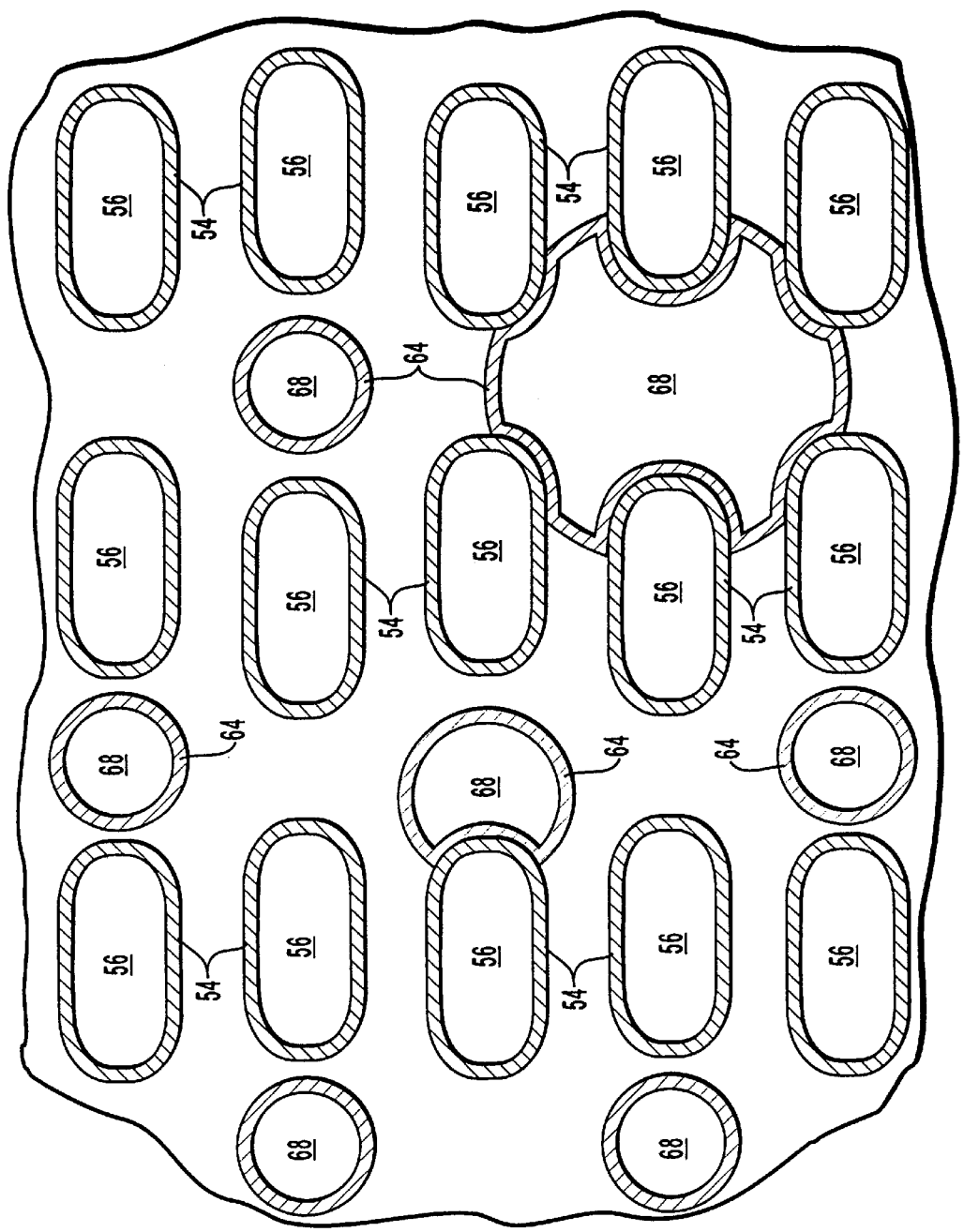
FIGS. 6A and 6B are alternatively scaled top plan views of FIG. 6.
Figure 6B:
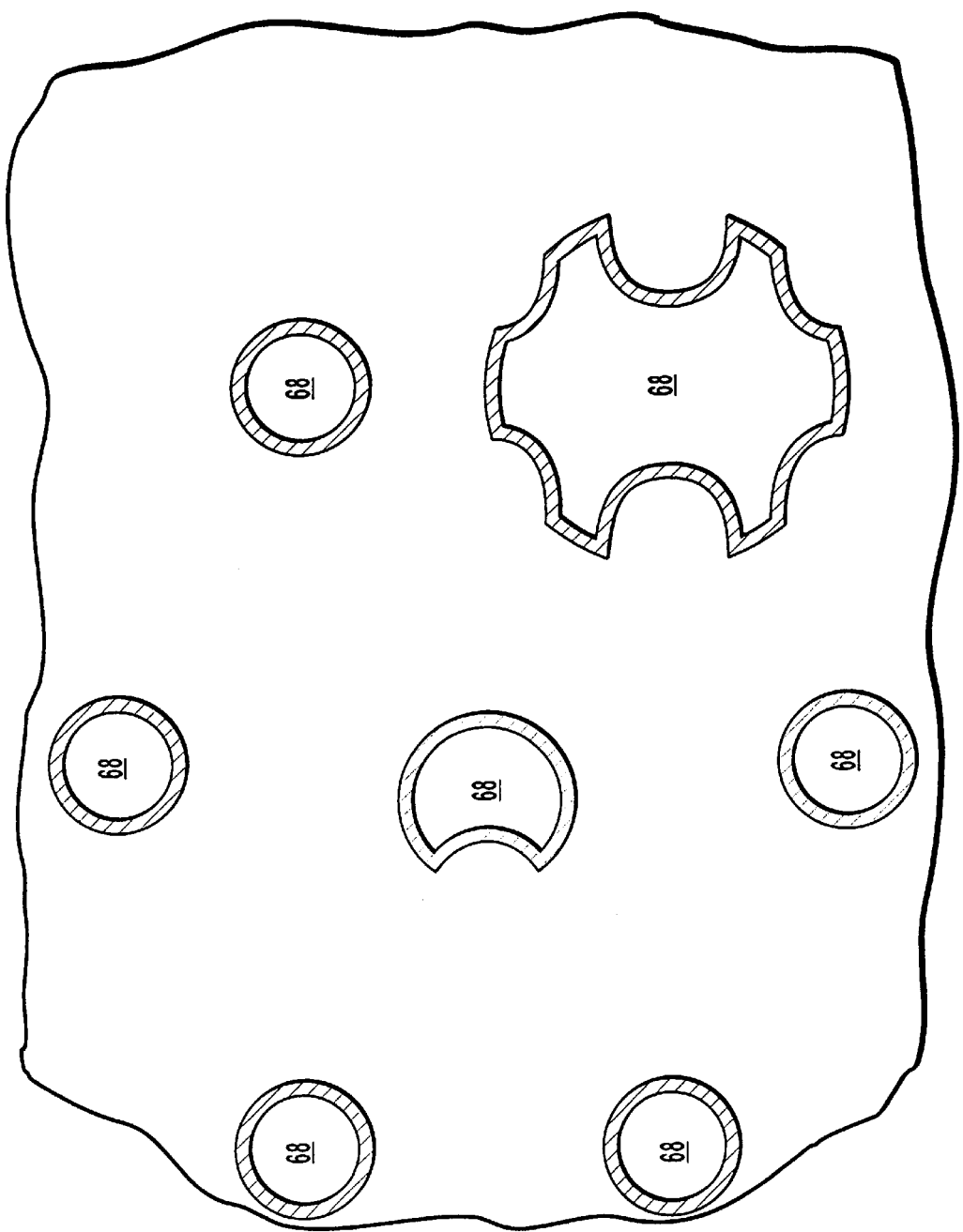

The described process flow has also the following characteristics which makes the printing of the plugs connecting to the cell nodes first the preferable way of implementing the invention. As seen in FIGS. 1 to 6, and more particularly in the top plan views of FIGS. 2A, 4A, 6A, and 6B, it turns out that, in the case of overlapping polysilicon plugs, the pattern of the plug printed firstly is the one that remains unchanged in shape, while the ones that follow are reduced in size and shape by the first one in case of pattern overlap. Thus, the pattern etched in the first oxide etch 52 and protected by the spacer 54, and the polysilicon plug 56 all remain unchanged throughout the process. Conversely, second etch patterns 66 are changed into patterns 68 seen in FIGS. 6A, 6B by etching steps. Since the mask used for the cell capacitor formation is nearly identical to the mask used for the formation of the corresponding polysilicon plug, a better alignment between the cell capacitor and the underlying polysilicon plug is enabled by using the described ordering of the masks.

The ordering of the second and third masks described above is best determined based upon how MOS devices A through H and contacts thereto are formed upon P-doped silicon substrate 10 and N-doped silicon well 72.

In case of non-overlapping polysilicon plugs, the nitride spacers are optional for the purpose of isolating polysilicon plugs from each other. In case of overlapping polysilicon plugs, at least one nitride spacer is required surrounding the polysilicon plug to provide for the self-aligned isolation. As it can be derived from FIGS. 1 to 6B, either spacer 54, spacer 64, or both spacers 54 and 64 can be used to isolate the plugs laterally. The final CMP down to the level of the original BPSG accomplishes the vertical isolation at the locations 65. Preferably, nitride spacers 54, 64, and 96 will have a thickness from about 100 Angstroms to about 300 Angstroms.

Another advantage or reason for nitride spacers surrounding the BPSG layer laterally in the plug opening prior to polysilicon deposition is the excellent wet etch selectivity of the nitride spacers against oxide etches, especially HF-based chemicals. Typically, a 30 second long 100:1 HF etch is performed before plug polysilicon deposition to obtain good contact between the surface of the silicon substrate 10 or 72 and the plug. "Native" or remaining oxides have to be removed. This etch would also etch the BPSG laterally and open and widen the plug contacts in an undesired way. By using nitride spacers, this contact etch is avoided.

Another advantage or reason for the nitride spacers surrounding the doped polysilicon plugs is the excellent diffusion barrier of nitride films. Since the polysilicon plugs are surrounded by very highly doped BPSG which contains several percent of boron and phosphorus, the intentionally boron-doped polysilicon plugs could be contaminated/counterdoped with phosphorus outdiffusing from the BPSG and intentionally phosphorus or arsenic doped polysilicon plugs with boron from the BPSG film. This cross diffusion will not occur when nitride spacers are used. In order to decrease outdiffusing of dopants from BPSG layer 46 into the plugs 56, 68, 104, seen in FIGS. 6 and 10, a thickness of not less than 100 Angstroms is preferable for nitride spacers 54, 64, 96.

The foregoing novel process flow readily facilitates printing of the first, second, and third masks because the process separates the exposures of the first mask, which is similar to a contact mask requiring a high exposure dose, from the second mask, which is similar to a gate mask and requires a low exposure dose. Furthermore, the novel process flow permits a reduction of conventional pattern density in the MOS device array during the printing of the first and second masks. Stated otherwise, the inventive process splits up the polysilicon plug mask steps into two different masks. As such, the contact-like cell node polysilicon plug features are separated from the features of the bitline polysilicon plug and peripheral plugs. This separation of plug features betters the accuracy of the photolithography process in that the first mask can concentrate on printing the contacts using a high exposure dose, whereas the second exposure in the second mask can concentrate on printing larger trench-like features using lower exposure doses.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method of forming contacts comprising:
    forming a first mask upon a semiconductor substrate;
    patterning the first mask with a first pattern opening therein to expose a first contact on the semiconductor substrate, the first contact having a first shape;
    forming a first electrically conductive material upon the first contact;
    forming a second mask upon the semiconductor substrate;
    patterning the second mask with a second pattern opening therein to expose a second contact on the semiconductor substrate, wherein the second pattern opening overlaps the first pattern opening and the second contact has a second shape that is aligned with the first shape at an interface therebetween;
    forming a dielectric upon the semiconductor substrate; and
    forming a second electrically conductive material upon the second contact, the first and second electrically conductive materials having said dielectric situated therebetween.

2. The method as defined in claim 1, wherein the semiconductor substrate includes a doped silicon substrate and a MOS device sealed under a layer of nitride, there being a bitline contact on the semiconductor substrate on one side of the MOS device that is the first contact and a cellnode contact on the semiconductor substrate on an opposite side of the MOS device that is the second contact.

3. The method as defined in claim 2, wherein said forming a first mask upon a semiconductor substrate comprises:
    applying a passivation layer of oxide over the semiconductor substrate, the bitline contact, the cellnode contact and the MOS device; and applying a first layer of photoresist over the passivation layer of oxide.

4. The method as defined in claim 3, wherein said patterning the first mask with a first pattern opening therein to expose a first contact on the semiconductor substrate comprises:

exposing a portion of the first layer of photoresist that is situated above and vertically aligned with the cellnode contact and at least a portion of the MOS device, and leaving unexposed a portion of the first layer of photoresist that is above and vertically aligned with the bitline contact;

developing the first layer of photoresist; and etching with a first etch chemistry selective to nitride, silicon, and polysilicon through the passivation layer of oxide to expose the cellnode contact.

5. The method as defined in claim 4, wherein said forming a first electrically conductive material upon the first contact comprises:

depositing a first layer of thin nitride film over the passivation oxide layer and the cellnode contact;

etching anisotropically with a second etch chemistry the first layer of thin nitride film so as to form a substantially vertically oriented nitride spacer above the MOS device; and applying a first conductive layer over the doped silicon substrate, the MOS device, passivation layer of oxide layer, and cellnode contact.

6. The method as defined in claim 5, wherein said forming a second mask upon the semiconductor substrate comprises:

applying a second layer of photoresist over the integrated circuit structure;

exposing that the portion of the second layer of photoresist that is situated above and vertically aligned with: the bitline contact and at least a portion of the MOS device, and leaving unexposed that the portion of the second layer of photoresist that is above and vertically aligned with the cellnode contact;

developing the second layer of photoresist; and etching with a third etch chemistry through the first conductive layer with selectivity to oxide and to nitride.

7. The method as defined in claim 6, wherein said patterning the second mask with a second pattern opening therein to expose a second contact on the semiconductor substrate comprises:

etching with a fourth etch chemistry selective to nitride, polysilicon, and silicon through the passivation layer of oxide to expose the bitline contact.

8. The method as defined in claim 7, wherein said forming a dielectric upon the semiconductor substrate comprises:

depositing a second layer of thin nitride film;

etching anisotropically with a fifth etch chemistry the second layer of thin nitride film;

depositing a second layer of thin nitride film; and etching anisotropically with a fifth etch chemistry the second layer of thin nitride film.

9. The method as defined in claim 8, wherein said forming a second electrically conductive material upon the second contact comprises:

depositing a second conductive layer over the bitline contact and at least a portion of the MOS device.

10. The method as defined in claim 9, further comprising:

performing a chemical-mechanical polishing process, whereby the first conductive layer forms a cellnode plug to the cellnode contact, the second conductive layer forms a bitline plug to the bitline contact, the cellnode plug and the bitline plug being separated by the nitride spacer above the MOS device.

11. The method as defined in claim 10, wherein the cellnode plug and the bitline plug are separated by a distance of not less than 200 Angstroms.

12. The method as defined in claim 10, wherein the area above the cellnode contact that is opened up by said etching with a first etch chemistry to expose the cellnode contact is substantially the same area that is filled up by the cellnode plug, and the area above the bitline contact that is opened up by said etching with a first, second and third etch chemistries to expose the bitline contact is greater than the area that is filled up with the bitline plug.

13. The method as defined in claim 4, further comprising ion implanting an active region in the silicon substrate below the cellnode contact after said etching with a first etch chemistry selective to nitride, silicon, and polysilicon through the passivation layer of oxide to expose the cellnode contact.

14. The method as defined in claim 7, further comprising ion implanting an active region in the silicon substrate below the bitline contact after said etching with a fourth etch chemistry selective to nitride, polysilicon, and silicon through the passivation layer of oxide to expose the bitline contact.

15. The method as defined in claim 10, wherein a nitride spacer above the MOS device isolates the cellnode plug from the bitline plug, whereby the isolation of the bitline plug and the cell node plug is unaffected by the alignment of the area above the bitline contact that is opened up by said etching with a third and fourth etch chemistries to expose the bitline contact.

16. The method as defined in claim 9, wherein a surface of the doped silicon substrate, the first conductive layer, and the second conductive layer are of the same doping.

17. The method as defined in claim 3, wherein the passivation layer of oxide is BPSG.

18. The method as defined in claim 9, wherein the first and second conductive layers are composed essentially of N-doped polysilicon.

19. A method for preparing an integrated circuit structure, said integrated circuit structure including a doped silicon substrate, and five MOS devices, each said MOS device being sealed under a separate layer of nitride in contact with the silicon substrate, there being a first bitline contact and a second bitline contact, each said bitline contact being in contact with the silicon substrate, the first bitline contact being situated between the separate nitride layers of the first and second MOS devices, and the second bitline contact being between the separate nitride layers of the fourth and fifth MOS devices, there being a first cellnode contact and a second cellnode contact, each said cellnode contact being in contact with the silicon substrate, the first cellnode contact being between the separate nitride layers of the third and fourth MOS devices, the second cellnode contact being between the separate nitride layers of the third and fourth MOS devices, the method comprises the steps of:

applying a passivation layer of oxide over and between first through the fifth MOS devices;

applying a first layer of photoresist over the passivation layer of oxide;

exposing the portions of the first layer of photoresist that are situated immediately above and aligned with:
both the first cellnode contact and at least a portion of the third MOS device; and both the first cellnode contact and at least a portion of the fourth MOS device;

developing the first layer of photoresist;

etching with a first etch chemistry selective to nitride, silicon, and polysilicon through the passivation layer of oxide to expose a first etch contact series comprising the first and second cellnode contacts;

depositing a first layer of thin nitride film over the passivation oxide layer, and the first etch contact series;

etching anisotropically with a second etch chemistry the first layer of thin nitride film so as to form a first nitride spacer above and in contact with the nitride layer of the first MOS device, a second nitride spacer above and in contact with the nitride layer of the second MOS device, a third and fourth nitride spacer above and in contact with the nitride layer of the third MOS device, a fifth nitride spacer above and in contact with the nitride layer of the fourth MOS device, and a sixth nitride spacer above and in contact with the nitride layer of the fifth MOS device, each of the first through sixth nitride spacers being vertically oriented and bounded on one side thereof to the passivation layer of oxide and, and each of the second through fifth nitride spacers being bounded on an opposite side thereof by an opening to one of said first and second cellnode contacts;

applying a first conductive layer over the passivation oxide layer, and the first etch contact series;

applying a second layer of photoresist over the integrated circuit structure;

exposing the second layer of photoresist that are situated immediately above and substantially aligned with:
the portion thereof from the first nitride spacer to the second nitride spacer; and
the portion from the fifth nitride spacer to the sixth nitride spacer;

developing the second layer of photoresist;

etching with a third etch chemistry through the layer of thin oxide film over the first conductive layer;

etching with a fourth etch chemistry through the first conductive layer with selectivity to oxide and to nitride;

etching with a fifth etch chemistry selective to nitride, polysilicon, and silicon through the passivation layer of oxide to expose the first and second bitline contacts;

depositing a second layer of thin nitride film over the area extending from the first MOS device to the fifth MOS device;

etching anisotropically with a sixth etch chemistry the second layer of thin nitride film so as to form a seventh nitride spacer having a length greater than the first nitride spacer and being above and in contact with the nitride layer of the first MOS device, to form a longer linear extension of the second nitride spacer, and an eighth nitride spacer having a length greater than the fifth nitride spacer and above and in contact with the nitride layer of the fourth MOS device, and to form a longer linear extension of the sixth nitride spacer above and in contact with the nitride layer of the fifth MOS device, the seventh nitride spacer being bounded on one side thereof to both the passivation layer of oxide and the first conductive layer, and on an opposite thereof to an opening to the first bitline contact, the longer extension of second nitride spacer being bounded on one side thereof to the first conductive layer and on an opposite side thereof to an opening to the first bitline contact, the eight nitride spacer being bounded on one side thereof to both the passivation layer of oxide and the first conductive layer, and on an opposite side thereof to an opening to the second bitline contact, and the longer extension of sixth nitride spacer being bounded on one side thereof to the first conductive layer, and on an opposite side thereof to an opening to the second bitline contact, each of said seventh nitride spacer, extension of the second nitride spacer, eight nitride spacer, and extension of the sixth nitride spacer being substantially vertically oriented;

depositing a second conductive layer over the area between the first MOS device and the fifth MOS device so as cover the first and second bitline contacts; and performing a chemical-mechanical polishing step, whereby the first conductive layer forms two separated contacts, respectively, with the first and second cellnode contacts, and the second conductive layer forms two separated contacts, respectively, to the first and second bitline contacts.

20. The method as defined in claim 19, wherein the step of performing a chemical-mechanical polishing step reduces the height of the first and second conductive layers below the length of the second nitride spacer above and in contact with the nitride layer of the second MOS device formed by the step of etching with a second etch chemistry, whereby the isolation of the first conductive layer contacting the first cellnode contact from the second conductive layer contacting the first bitline contact is unaffected by the alignment of the area above the first bitline contact that is opened up by the steps of etching with a third, fourth, and fifth etch chemistries to expose the first bitline contact.

21. The method as defined in claim 19, wherein the first conductive layer contacting the first cellnode contact is separated by a distance of greater than 200 Angstroms from the second conductive layer contacting the first bitline contact after the chemical-mechanical polishing step.

22. The method as defined in claim 19, further comprising the step of ion implanting active regions in the silicon substrate below the first and second bitline contacts prior to the step of depositing a second conductive layer over the area between the first MOS device and the fifth MOS device so as cover the first and second bitline contacts.

23. The method as defined in claim 19, wherein the first nitride spacer above and in contact with the nitride layer of the first MOS device has a thickness of not less than 100 Angstroms after the step of etching anisotropically with a second etch chemistry the first layer of thin nitride film, whereby outdiffusing of dopants into the cellnode plug and the bitline plug is prevented.

24. The method as defined in claim 19, wherein the doped silicon substrate, the first conductive layer, and the second conductive layer are of the same doping.

25. The method as defined in claim 19, wherein the passivation layer of oxide is BPSG.

26. The method as defined in claim 19, wherein the first and second conductive layers are composed essentially of N-doped polysilicon.

27. The method as defined in claim 19, wherein said integrated circuit structure further comprises an oppositely doped silicon well in said doped silicon substrate, a field oxide region extending above and between the silicon well and the silicon substrate, a sixth and seventh MOS device on and above said silicon well, each said sixth and seventh MOS devices being sealed under a separate layer of nitride in contact with the silicon well, there being a first and second device contact, each said first and second device contact being in contact with the silicon well, the first device contact being situated between the field oxide region and the nitride layer of the sixth MOS devices, the second device contact being situated between the separate nitride layers of the sixth and seventh MOS devices, said first conductive layer being situated on said silicon substrate from said sixth nitride spacer to a nitride spacer extending vertically above said field oxide region, said passivation layer of oxide being situated on said silicon well and over the nitride spacers of the sixth and seventh MOS devices and extending vertically for an essentially similar length as the first conductive layer above the second and third MOS devices, said method further comprising the steps of:

applying a third layer of photoresist over the passivation layer of oxide over the sixth and seventh MOS devices;

exposing the portions of the third layer of photoresist that are situated immediately above and aligned with the first and second device contacts;

developing the third layer of photoresist;

etching with an eight etch chemistry through the passivation layer of oxide over and to expose the first and second contacts;

depositing a third conductive layer at least over the area between the first device contact and the seventh MOS device so as to cover the first and second device contacts; and performing a chemical-mechanical polishing step, whereby the third conductive layer forms a contact with the first device contact and a separated contact to the second device contact.

28. The method as defined in claim 27, further comprising the step of cleaning the third layer of photoresist from the integrated circuit structure prior to said step of depositing a third layer of thin nitride film over the area extending from the field oxide region to the seventh MOS device.

29. The method as defined in claim 27, further comprising the steps of:

depositing a third layer of thin nitride film over the area extending from the field oxide region to the seventh MOS device after the step of etching with an eighth etch chemistry through the passivation layer of oxide over and to expose the first and second device contacts; and then etching anisotropically with a ninth etch chemistry the third layer of thin nitride film so as to form:

ninth and tenth vertically oriented nitride spacers above the nitride layer of the sixth MOS device and on opposite sides thereof, the ninth nitride spacer being separated from the tenth nitride spacer by the passivation layer of oxide, the ninth nitride spacer being aligned aside the first device contact opposite the nitride spacer extending vertically above the field oxide region, the tenth nitride spacer being aligned aside of the second device contact opposite of the seventh MOS device; and eleventh and twelfth vertically oriented nitride spacers above the nitride layer of the seventh MOS device and on opposite sides thereof, the eleventh nitride spacer being aligned aside the second device contact opposite of the sixth MOS device, and the twelfth nitride spacer being separated from the eleventh nitride spacer by the passivation layer of oxide.

30. The method as defined in claim 27, further comprising the step of ion implanting active regions in the silicon substrate below the first and second device contacts having a doping opposite to that of the silicon well prior to the step of depositing a third conductive layer at least over the area between the first device contact and the seventh MOS device so as to cover the first and second device contacts.

31. The method as defined in claim 27, further comprising the step of etching with a tenth etch chemistry the third conductive layer in a dry etchback process prior to the step of performing a chemical-mechanical polishing step to form a contact with the first device contact and a separated contact to the second device contact.

32. The method as defined in claim 27, wherein a surface of the doped silicon well and the third conductive layer are the same doping.

33. The method as defined in claim 27, wherein the third conductive layer are composed essentially of P-doped polysilicon.

34. The method as defined in claim 19, wherein:

the step of exposing the first layer of photoresist has an exposure dosage that is greater than an exposure dosage of the step of exposing the second layer of photoresist; and the step of exposing the first layer of photoresist exposes a volume of the first layer of photoresist that is less than a volume of the second layer of photoresist that is exposed by the step of exposing the second layer of photoresist.

* * * * *

UNITED STATES PATENT AND TRADEMARK OFFICE
CERTIFICATE OF CORRECTION

PATENT NO. : 6,207,564 B1  Page 1 of 1
DATED : March 27, 2001
INVENTOR(S) : Werner Juengling It is certified that error appears in the above-identified patent and that said Letters Patent is hereby corrected as shown below:

ABSTRACT,
Line 1, after "preparing" change "an" to -- a --

Column 5,
Line 27, before "the spacers" change "This, " to -- Thus, --

Column 6,
Line 57, before "a thickness" change "having" to -- have --

Column 11,
Line 23, insert a comma after "oxide"
Line 23, before "and each" delete "and,"

Signed and Sealed this

First Day of January, 2002

Attest:

JAMES E. ROGAN
Attesting Officer    Director of the United States Patent and Trademark Office